(12) United States Patent
Fayet et al.

(10) Patent No.: US 8,486,488 B2
(45) Date of Patent: Jul. 16, 2013

(54) METHOD AND DEVICE FOR COATING A POLYMER FILM WITH AN OXIDE LAYER

(75) Inventors: Pierre Fayet, Lausanne (CH); Torsten Olofsson, Romont (CH); Hans-Jurgen Tiller, Jena (DE); Thomas Richter, Jena (DE)

(73) Assignee: Tetra Laval Holdings & Finance S.A., Pully (CH)

(*) Notice: Subject to any disclaimer, the term of this patent is extended or adjusted under 35 U.S.C. 154(b) by 802 days.

(21) Appl. No.: 12/092,363

(22) PCT Filed: Nov. 2, 2006

(86) PCT No.: PCT/CH2006/000617
§ 371 (c)(1),
(2), (4) Date: Sep. 22, 2008

(87) PCT Pub. No.: WO2007/051340
PCT Pub. Date: May 10, 2007

(65) Prior Publication Data
US 2009/0199964 A1    Aug. 13, 2009

(30) Foreign Application Priority Data
Nov. 3, 2005   (CH) .................................. 1765/05

(51) Int. Cl.
*C23C 16/00*   (2006.01)
(52) U.S. Cl.
USPC .............. 427/255.5; 427/255.7; 427/255.24; 427/255.28; 427/585

(58) Field of Classification Search
USPC .......................................... 427/452, 453, 454
See application file for complete search history.

(56) References Cited

U.S. PATENT DOCUMENTS

| | | | | |
|---|---|---|---|---|
| 2,683,894 A | * | 7/1954 | Kritchever | 425/445 |
| 3,318,744 A | * | 5/1967 | Hurley | 156/82 |
| 4,203,553 A | * | 5/1980 | Bachman et al. | 239/420 |
| 5,735,754 A | * | 4/1998 | Antonious | 473/328 |
| 5,900,317 A | * | 5/1999 | Strobel et al. | 428/412 |
| 5,967,047 A | * | 10/1999 | Kuhn et al. | 101/454 |
| 5,997,956 A | * | 12/1999 | Hunt et al. | 427/446 |
| 6,919,107 B2 | * | 7/2005 | Schwarzenbach et al. | 427/569 |

FOREIGN PATENT DOCUMENTS

| | | |
|---|---|---|
| DE | 102004029911 A1 | 1/2005 |
| EP | 1209252 A2 | 5/2002 |
| WO | 02/25693 | 3/2002 |

* cited by examiner

*Primary Examiner* — David Turocy
(74) *Attorney, Agent, or Firm* — Rankin, Hill & Clark LLP

(57) ABSTRACT

A web of a polymer film (1) is coated with an oxide layer, in particular with an $SiO_x$ barrier layer, by transporting the web with the aid of a rotatable drum (12) through a plurality of flame bands, which are directed in a radial direction from above against the circumferential surface of the drum, which extend at a distance from each other across the width of the web being supported and transported on this circumferential surface, and which are fed with a gas mixture including a combustible gas, an oxidant, and a silicon containing compound. Therein the circumferential surface of the rotatable drum is cooled to a predetermined temperature and the web is transported through the area of the tip of the inner flame region. Polymer films with barrier layers produced in the named way have at small layer thicknesses of less than 10 nm very good barrier properties.

12 Claims, 4 Drawing Sheets

METHOD AND DEVICE FOR COATING A POLYMER FILM WITH AN OXIDE LAYER

BACKGROUND OF THE INVENTION

The invention is situated in the field of the packaging technology. It concerns a method and a device that serve for coating a polymer film with an oxide layer, in particular with a barrier layer of silicon oxide ($SiO_x$).

Polymer film or sheet material e.g. of PET (polyethylene terephthalate), PA (polyamide), PP (polypropylene) or PE (polyethylene) is coated with a thin barrier layer of silicon oxide for improving the barrier properties thereof, i.e. for reducing its gas permeability, in particular its permeability for oxygen, water vapor, carbon dioxide, and aroma compounds. Polymer films usually have a thickness of e.g. 1 to 100 μm, polymer sheets are thicker. In the following, the term polymer film is used to include not only the very thin material but also the thicker material, which is usually termed sheet material.

The barrier layer has a composition of $SiO_x$ and may also contain hydrogen, carbon and/or nitrogen. The coated polymer film is useful for a number of packaging applications, e.g. for cardboard brick packages, for beverages in which the polymer film forms an inner lining. The transparency of the barrier layer allows for its use in transparent packaging materials also, e.g. in sheet materials for pouches or for tray lids.

According to the state of the art, $SiO_x$ barrier layers, as shortly described above, are deposited on polymer film e.g. in a PECVD-process (plasma enhanced chemical vapor deposition process) wherein a web of the polymer film, usually supported by a rotating drum, is transported through a plasma being sustained at a reduced pressure and wherein a process gas mixture containing an organosilicon compound (e.g. hexamethyldisiloxane or HMDSO) or an inorganic compound containing silicon (e.g. $SiCl_4$, $SiH_4$) is fed into the plasma. Reactive silicon based particles which are produced in the plasma by decomposition of the organosilicon compound are deposited on the exposed surface of the polymer film to form the barrier layer. In particular for coating a web of the polymer film being supplied in rolls, the reduced pressure of the process necessitates equipment of high cost and the process needs to be interrupted for each roll exchange (non-continuous or batch roll-to-roll process).

Plasma enhanced deposition processes carried out at ambient pressure, for producing barrier layers (DBD-process or dielectric barrier discharge process), also belong to the state of the art. Obviously, a device for carrying out such an ambient pressure process is considerably simpler than the device needed for the reduced pressure process, and rolls can be exchanged without interruption of the process (continuous roll-to-roll process). However, long development work has not been able to reduce energy and process gas consumption of the ambient pressure plasma process to an acceptable level and the necessary high power density makes it very difficult if not impossible to produce large quantities of coated polymer film having a constant high quality.

Other known processes for producing silicon or aluminum oxide barrier layers are evaporation and reactive evaporation which are also carried out at reduced pressure and therefore have the same disadvantages as the above mentioned reduced pressure PECVD-process.

It is further known to treat substrate surfaces by exposing the surface to a flame. Such treatment is applied for giving the substrate a hydrophilic or adhesion promoting surface as is used for printing, lacquering or gluing surfaces of polymer, glass or metal substrates.

BRIEF SUMMARY OF THE INVENTION

It is the object of the invention to create a method and a device for coating a polymer film with an oxide layer, in particular with a barrier layer of silicon oxide, wherein a coated polymer film produced by the method is to have at least as good barrier properties as similar polymer films coated in a known reduced pressure PECVD-process and wherein the method does not have the disadvantages of a reduced pressure process.

In principle, the method according to the invention is a flame-induced combustion chemical vapor deposition process (CCVD-process), wherein the polymer film is exposed to a flame being directed towards the film surface to be coated, which flame is fed with a gas mixture comprising a combustible gas and an oxidant gas (e.g. air, mixture of air and oxygen, or oxygen) and a compound which is able to decompose in the flame to form reactive particles capable of being deposited in the form of the desired layer. For depositing an $SiO_x$ barrier layer the decomposable compound is an inorganic or organic compound containing silicon (e.g. hexamethyldisiloxane, $SiCl_4$, $SiH_4$). Compounds which decompose in the flame in the named manner are substantially the same compounds as the ones which decompose in the same way in a plasma.

For designing the CCVD-process, the following findings are to be taken into account: firstly, exposure to too high temperatures over more than a very short time causes thermal damage in the film material and therefore decreases barrier quality and, secondly, barrier quality of the coating increases with the temperature in the flame region to which the polymer film is exposed. For these two reasons the polymer surface is preferably exposed to a high temperature flame and flame region, but exposure time is kept short and a plurality of successive coating steps are carried out, alternating with cooling steps, in which the polymer film is cooled from its surface opposite the surface to be coated. Furthermore, it is found that barrier quality is the better, the higher the reactivity and the lower the contamination of the deposited surface can be kept between successive coating steps, i.e. the shorter the cooling steps between successive coating steps are, and the higher the surface temperature of the film substrate is kept.

For achieving good barrier qualities, the coating is therefore carried out in a plurality of alternating short coating and cooling steps and to therein keep the temperature of the film material within a temperature range which is as narrow as possible, and is situated in a temperature range in which the film material is not thermally damaged and not deformed by the necessary handling. In other words, the cooling temperature is to be chosen considerably below the melting temperature of the polymer film material. This is advantageously achieved by the following measures:

For suitably high flame temperatures, the polymer film is passed through the flame in the area of the tip of the inner (reductive) flame region (area of highest flame temperature) and the gas mixture for feeding the flame is e.g. a propane/air mixture with a ratio between 1/14 and 1/28, preferably between 1/20 and 1/25 and even more preferably of 1/22 (mixture ratios for other combustible gases to be calculated in relation to theoretic stoichiometric mixtures).

For keeping the film surface to be coated at a high temperature, the cooling temperature is chosen at the highest temperature that allows for handling the film without damage, and cooling steps are kept as short as possible, i.e. just long enough for preventing temperature build-up from coating step to coating step. For each specific film material the optimal cooling temperature is to be determined by corresponding experiments.

Experiments show that for coating a PET film of 12 μm thickness with an $SiO_x$ barrier layer having good barrier properties, the process parameters are to be chosen as follows:

gas mixture: propane and air at a ratio of 1/22.
cooling temperature: 50 to 120° C.,
flame region to which the film surface is exposed: not more than ca. 5 mm on either side of the tip of the inner flame region (preferably not more than ca. 5 mm beyond the tip of the inner flame region),
length of coating steps: 20 to 300 ms
length of cooling steps: 0.2 to 5 s,
supply of silicon containing compound: to result in deposition of ca. 2 to 20 nm $SiO_x$ per flame passage,
number of passages: 2 to 10.

Obviously, it is necessary for each different film material and also for different film thicknesses to find the optimum process parameters by conducting corresponding experiments.

In the above described embodiment of the method according to the invention, the same gas mixture is used in all coating steps (flame passages). However, this is not a condition for the method according to the invention. The method can be carried out also using differing gas mixtures in successive coating steps. In this way it becomes possible to produce layers in the form of stacks of nanometer layers, e.g. alternating nanometer layers of $SiO_x$ and $AlO_x$.

For producing a barrier coating of $SiO_x$, the compound to be decomposed is a silicon containing compound, e.g. hexamethyldisiloxane (HMDSO) or $SiCl_4$ or $SiH_4$ which is present in the gas mixture in a concentration of less than 10% in weight.

The main elements of the device for carrying out the method according to the invention are a support surface which is equipped for supporting and for cooling the polymer film and for transporting it through the flames, and a plurality of means for sustaining flames and directing them against the film surface to be coated, the means for sustaining and directing being connected to a gas mixture supply means.

For a polymer film in the form of a web, the means for sustaining and directing the flames comprise a nozzle matrix (two dimensional matrix or row) each, which is designed for sustaining a flame band extending with a constant width across the width of the web. The support surface is the circumferential surface of a rotating drum and the means for sustaining and directing the flame bands are arranged to face this circumferential surface in a radial direction from above. The nozzles of the nozzle matrix are preferably small (diameter ca. 1 mm) and the distances between the nozzles within the nozzle matrix are small enough for producing a flame band having an uninterrupted inner flame region (inner flame regions of individual flames touching or overlapping).

The device further comprises metering means for producing the gas mixture and preferably exhaust means for removing exhaust gas and, for a roll-to-roll process, means for unrolling the film web to be coated and for rolling up the coated film. The device is preferably located within a suitable housing which can be opened for exchanging film rolls on the supply side and on the removal side without interrupting the coating process.

If the polymer film to be coated is not a web but comes e.g. in separate pieces, it may be advantageous to not transport the polymer film through the flames but to transport a flame or flame band across the surface to be coated, wherein it is possible to use only one flame or flame band and to pass it over the film surface more than once.

It is found that barrier layers produced on polymer films in a CCVD-process using the above described process and device show very good barrier properties at even smaller layer thicknesses (less than 10 nm) than similar barrier layers produced in reduced pressure PECVD-processes (layer thickness 10 to 30 nm).

The barrier layers produced with the aid of the method according to the invention or the coated polymer films respectively are suitable as gas barriers (in particular barriers for oxygen, nitrogen, carbon dioxide, water vapor, or organic compounds such as alcohol, ethylene and aroma compounds) in packages for food stuffs or beverages in the same way as similar films produced according to the state of the art. The barrier layers are transparent, colorless and microwaveable and have a thickness of 5 to 200 nm, preferably of 5 to 20 nm. A 12 μm thick PET-film coated with the method according to the invention has e.g. an oxygen transmission rate (OTR) between 1 and 3 $cm^3/m^2/day/atm$. Deposition rates of at least 10 nm/s are achieveable.

One skilled in the art will be able to adapt the above described process not only for being used with other film or sheet materials, but also for deposition of other oxide layers, e.g. of aluminum oxide, titanium oxide, cerium oxide or oxides of other rare earths or a mixed oxide.

BRIEF DESCRIPTION OF THE DRAWINGS

The method and exemplary embodiments of the device according to the invention are described in further detail in connection with the following Figures, wherein.

DETAILED DESCRIPTION OF THE INVENTION

Figure 1:
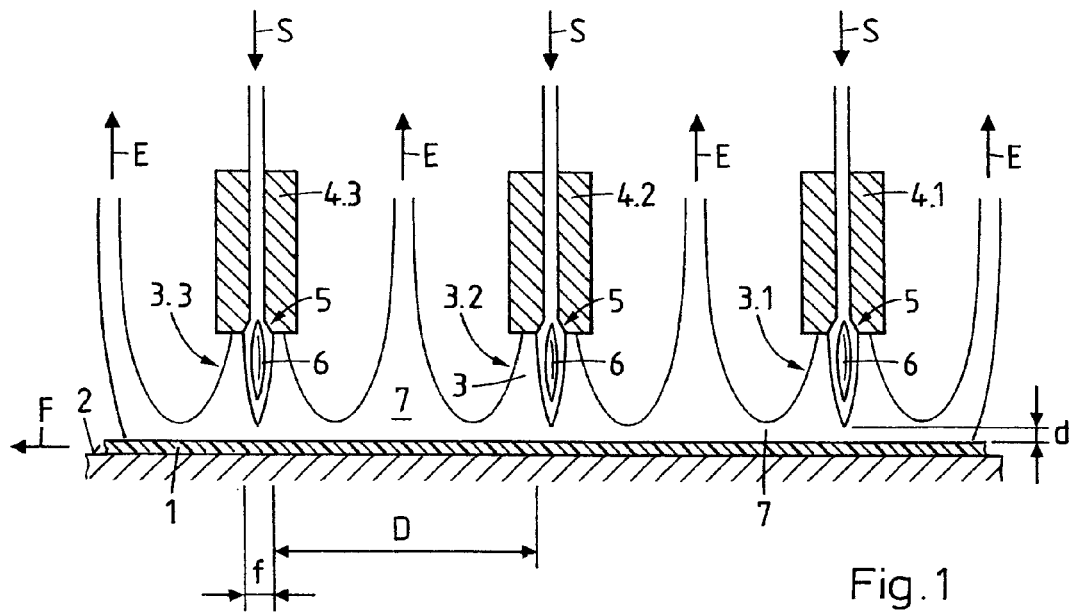
FIG. 1 shows the principle of the method according to the invention, which method serves for depositing a barrier layer of $SiO_x$ (or other oxide layer) on a polymer film.

FIG. 1 illustrates the method according to the invention. It shows, in section parallel to the direction F of the film transport, the polymer film 1 being supported on the support surface 2, which is kept at a predetermined temperature (cooling temperature) with suitable means. Flames 3 or in particular successive flame bands 3.1, 3.2 and 3.3 originating from nozzle matrices 4.1, 4.2 and 4.3 each with a plurality of nozzles 5 (one nozzle visible for each matrix) extend across the width of the polymer film, e.g. perpendicular to direction F of the film transport. The nozzles 5 are connected to a supply means which supplies the gas mixture (arrows S) to the nozzles 5.

The flame bands 3.1, 3.2 and 3.3 comprise an inner flame region 6 and an outer flame region 7, wherein the inner flame regions of individual flames originating from individual nozzles of the nozzle matrix touch or overlap such that a continuous inner flame band extends across the width of the film 1, the individual flames being visible only as individual small tips at the outer end of the continuous flame bands. The outer flame region 7 which envelopes the inner flame region 6 of each band may (as shown in FIG. 1) converge with outer flame regions 7 of neighboring flame bands and may continue towards exhaust means (arrows E) which are advantageously arranged between neighboring flame bands.

The flame bands are directed in a radial direction from above against the polymer film 1 to be coated, as shown in FIG. 1. Even without active exhaust means arranged between flame bands, passive exhaust will have a direction which corresponds substantially to the direction of arrows E, thus reducing the heat load on the film material and on the support surface 2.

Figure 3:
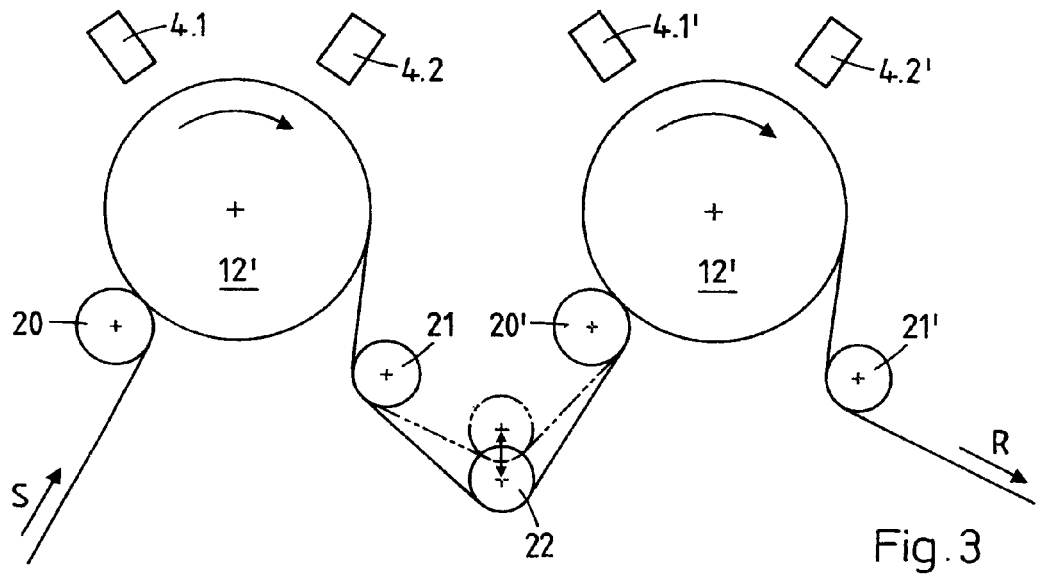
FIG. 3 shows again in a very schematic manner a further exemplary embodiment of the device according to the invention, which embodiment serves for coating a quasi endless web of polymer film in an in-line or roll-to-roll process.

Active exhaust is able to prevent undesired build-up of heat in the vicinity of the flames which may render cooling of the film material between coating steps not possible. On the other hand, too strong active exhaust may cause undesirably strong air flow against the flame direction such that a considerable part of the active particles produced within the flames are diverted away from the film surface to be coated, which reduces deposition rate and efficiency of the progress. In order to prevent the named undesired build-up of heat and still keep active exhaust at an acceptably low level, it may be advantageous to introduce, between groups of alternating coating and short cooling steps, one (or more than one) larger cooling step in which the film material is cooled to ambient temperature. Such a process is illustrated in FIG. 3.

FIG. 1 also shows the process parameters f (width of flame band in direction F of film transport), D (distance between flame bands in direction F of film transport) and d (distance between tip of inner flame region and film surface to be coated). The parameters f and D are matched to the film speed and the cooling capacity of the support surface 2 to give the desired length for coating and cooling steps such that the temperature of the film material stays within the named narrow temperature range. As described above, the parameter d is preferably small (5 mm or less) and is preferably positive (surface to be coated passes outside the inner flame region) but may also be negative (surface to be coated passes inside the inner flame region). The parameter d is determined by the distance between the nozzles 5 and the support surface 2 and by the amount of gas mixture flowing through each nozzle per time unit, wherein at a given nozzle cross section, the height of the inner flame region 6 above the nozzle is about proportional to the amount of gas mixture flowing through the nozzle.

Figure 2:
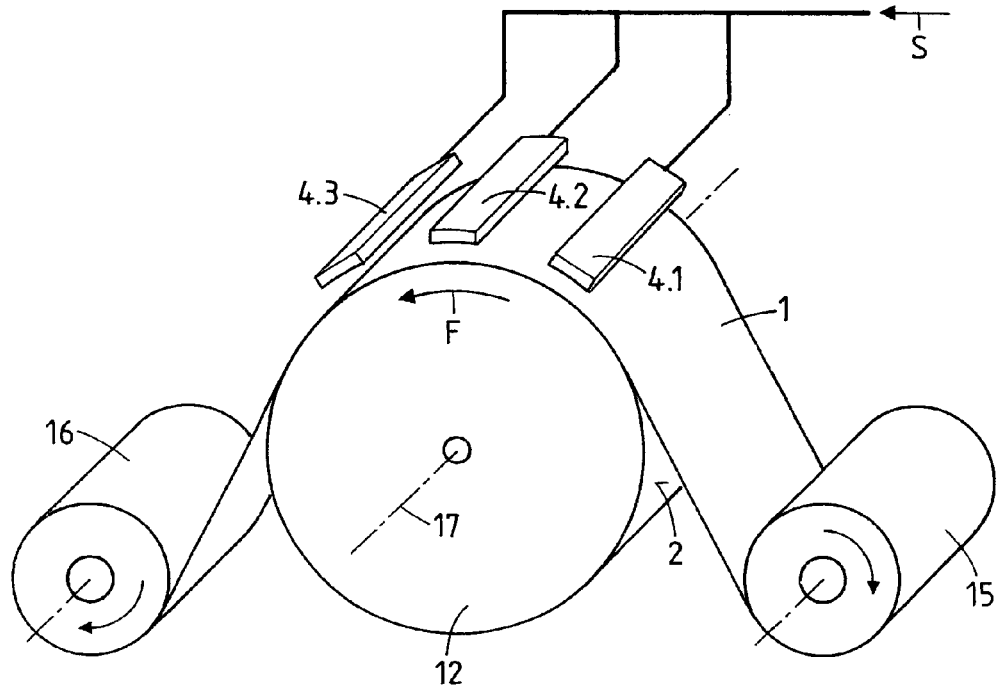
FIG. 2 shows in a very schematic manner an exemplary embodiment of the device according to the invention, which embodiment serves for coating a quasi endless web of polymer film in a roll-to-roll process.

FIG. 2 shows in a very schematic manner a first exemplary embodiment of the device according to the invention. This device is equipped for depositing a barrier layer on a quasi endless web of polymer film 1. The support surface 2 is the circumferential surface of a rotating drum 12. The web 1 is unrolled from a supply roll 15, is passed through the flame bands (not shown) while being supported on the circumferential surface 2 of an upper part of the rotating drum 12 and is then rolled onto a product roll 16. The circumferential surface of the drum 12 is kept at a constant temperature in a suitable manner. For producing the flame bands, a plurality of (in particular three) nozzle matrices 4.1, 4.2 and 4.3 are arranged above the drum 12. The nozzle matrices extend at a distance from the circumferential surface (support surface 2) of the drum and parallel to the drum axis 17. The nozzles are directed from above substantially radially towards the circumferential surface and the nozzle matrices are connected in a per se known manner e.g. via a supply manifold to a gas supply (arrow S).

FIG. 3 shows, again in a very schematic manner, a further exemplary embodiment of the device according to the invention. This device is suitable either as the device according to FIG. 2 for a roll-to-roll process (rolls not shown) or for an in-line process, in which the film material is supplied (arrow S) to the device e.g. directly from a device (e.g. blowing or extrusion device) in which it is produced and possibly mono-oriented, and, after coating, is removed (arrow R) to be supplied e.g. directly to a device in which it is laminated to another, thicker film or sheet material or between two such materials. The advantage of the described in-line process is the fact that the heat exhausted from the coating process can be fed to either device upstream or downstream of the coating device.

The device as shown in FIG. 3 comprises two drums 12 and 12' arranged in succession. Each drum 12 and 12' is equipped with two nozzle matrices 4.1 and 4.2, 4.1' and 4.2', which are arranged above the drum and distanced from each other for providing for a short cooling step between two successive coating steps, wherein during the short cooling steps the web is cooled down to approximately the temperature of the drum circumferential surface. The distance between the two drums 12 and 12' provides a longer cooling step as mentioned further above, in which longer cooling step the web is cooled down to approximately ambient temperature.

Both drums 12 and 12' are further equipped with a pressure roller 20 and 20' which is arranged to be pressed against the drum circumferential surface upstream of the pair of nozzle matrices, and with an exit roller 21 and 21' arranged off the drum circumferential surface downstream of the nozzle matrices. The pressure rollers serve for eliminating air between the drum circumferential surface and the web, which air acts as a heat insulator and if not fully eliminated causes the web material to overheat and therewith to get damaged. The exit rollers 21 and 21' help to cool down the web to about ambient temperature.

Pressure roller and exit roller are also applicable in a one-drum device as shown in FIG. 2.

Between the first drum 12 and the second drum 12', or between the exit roller 21 of the first drum 12 and the pressure roller 20' of the second drum 12' respectively, a tension roller 22 is arranged in a resilient manner such that it keeps the web between the drums at a predetermined tension. Furthermore, the tension roller may be arranged in a displaceable manner such that the web path between the two drums and therewith the length of the longer cooling step can be adapted for specific coating processes. FIG. 3 shows two positions of the tension roller 22: with drawn-out lines for a greater length of the longer cooling step and with interrupted lines for a smaller length of the longer cooling step.

Figure 4:
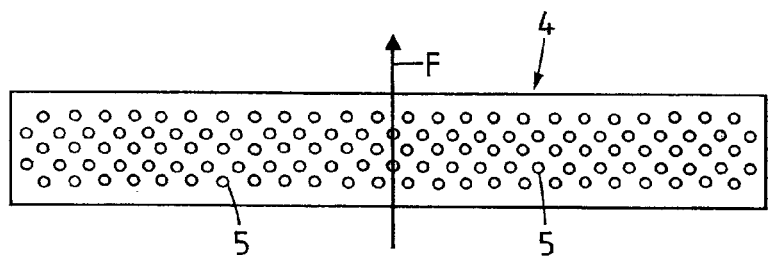
FIG. 4 shows a nozzle matrix as used in the devices according to FIG. 2 or 3.

FIG. 4 shows an exemplary embodiment of a nozzle matrix 4, viewed from the nozzle side. The nozzles 5 are arranged alternatingly in five parallel lines, extending substantially perpendicularly to the moving direction F of the polymer film. The nozzle rows are at least as long as the width (perpendicular to the moving direction F) of the polymer film. The nozzles have e.g. a diameter of 1 mm and, in the direction F of the film transport, the width of the nozzle matrix or the flame band respectively is e.g. about 10 mm.

Figure 5:
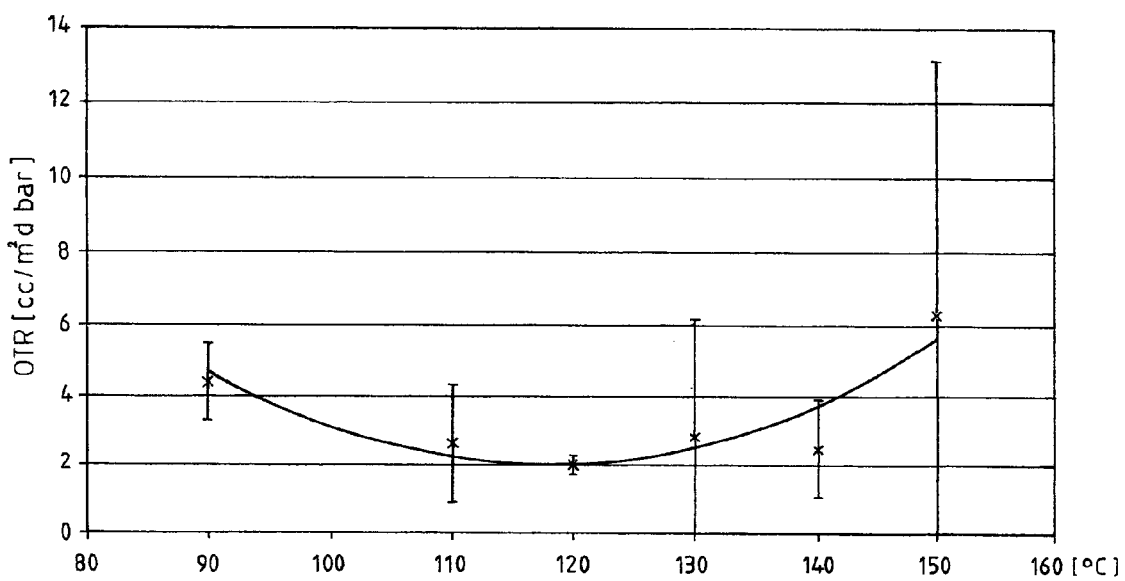
FIGS. 5 to 7 show graphs illustrating the barrier properties of a PET polymer film of 12 μm thickness and being coated with the method according to the invention in dependence of various method parameters.
Figure 6:
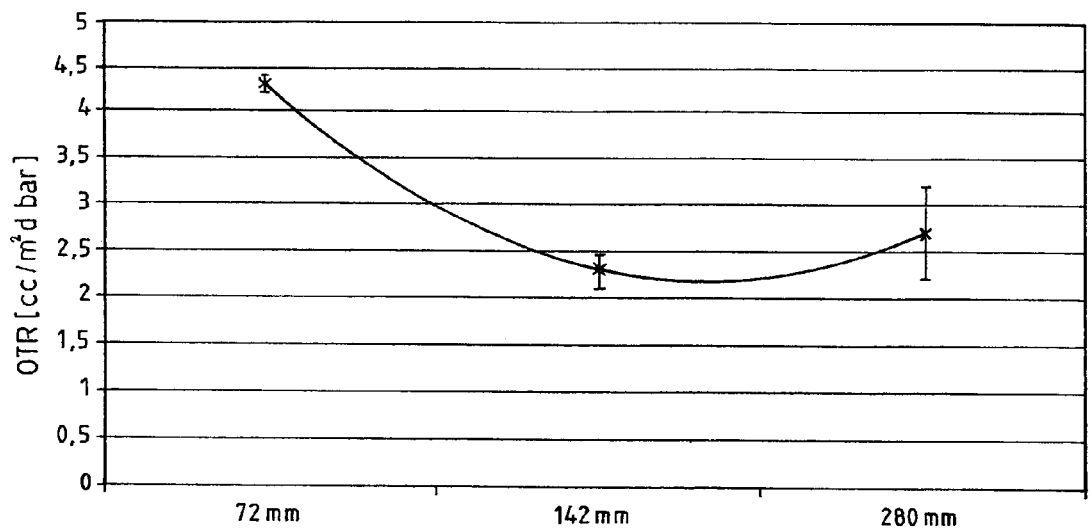
Figure 7:
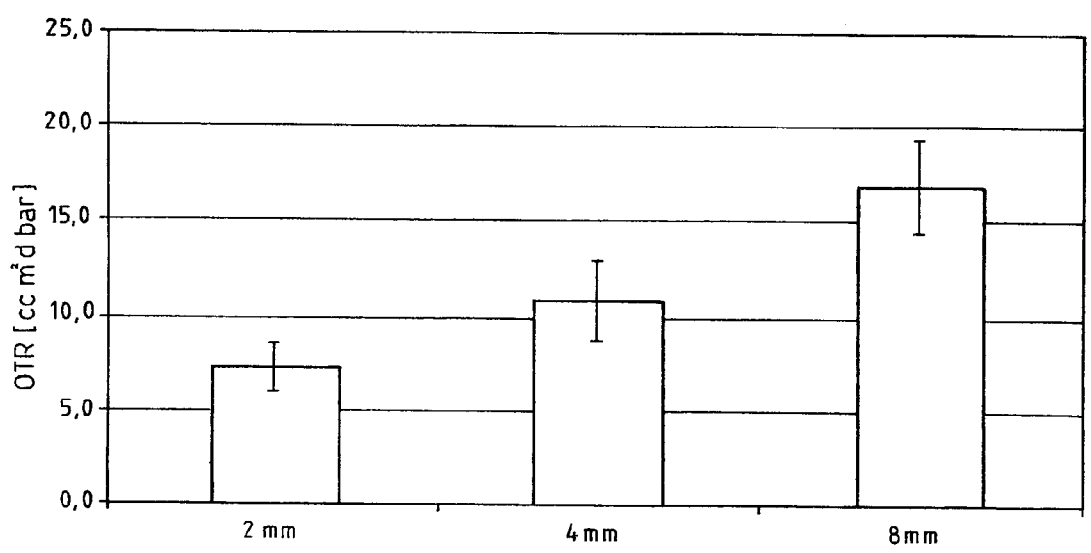

FIGS. 5 to 7 show the barrier quality (in particular OTR-value or oxygen transmission ratio in cubic centimeters of oxygen permeating through a square meter of polymer film per day at a pressure difference of 1 bar) versus various process parameters. The data are taken from a PET film of 12 μm thickness which was coated with an $SiO_x$ barrier layer in the process according to the invention.

FIG. 5 illustrates the OTR-value versus the set temperature of the support surface. The PET film was passed through five successive flame bands. The graph shows that the OTR decreases to a higher barrier quality with increasing temperature of the support surface to an optimum at about 120° C. and then increases again with further increasing temperature of the support surface. This shows that, for best results regarding barrier quality, the set temperature of the support surface is to be as high as possible and not far from a limit beyond which the polymer film is suffering thermal damage.

FIG. 6 shows dependence of the OTR value from the distance D in mm (see FIG. 1 for distance D) between successive flame bands. Here again, there is an optimum value regarding barrier quality which, for the chosen set-up, lies at about 150 mm. Obviously, at a value below the optimum value, the polymer film is not cooled enough between passages through flame bands and above the optimum value the time elapsed between flame passages is too long, resulting in deactivation and/or contamination of the surface to be coated, which obviously leads to a lower barrier quality.

FIG. 7 shows the dependence of the OTR value from the positive distance d in mm (see FIG. 1 for distance d) between the surface to be coated and the tip of the inner flame region, i.e. from the flame temperature of the flame area through which the polymer film is passed. Obviously, the barrier quality decreases (increasing OTR value) with increasing distance between the tip of the inner flame region and the surface to be coated, i.e. with decreasing flame temperature at the flame area through which the polymer film is passed.

Figure 8:
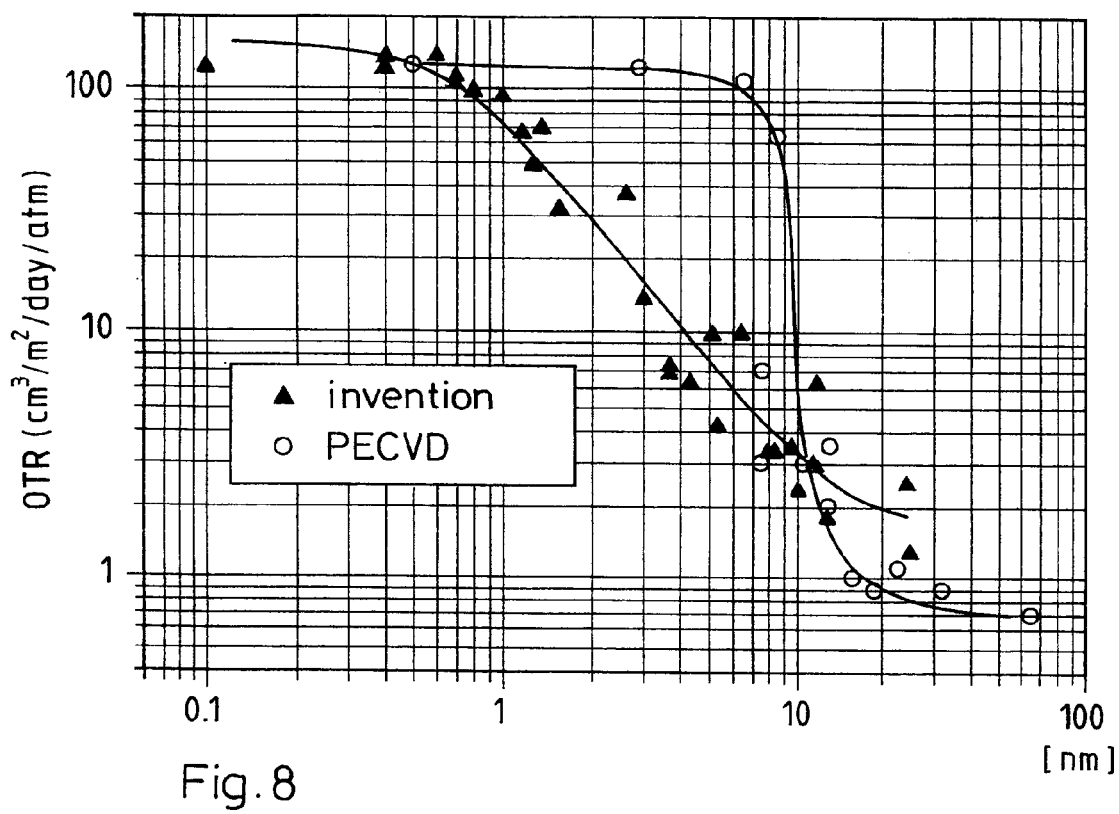
FIG. 8 shows the barrier properties of a PET polymer film of 12 μm thickness and being coated with the method according to the invention in comparison with a similar polymer film coated with a reduced pressure PECVD process (OTR vs. barrier layer thickness).

FIG. 8 shows a comparison between OTR values of a PET polymer film of a thickness of 12 μm and carrying an $SiO_x$ barrier layer produced with the method according to the invention and a similar polymer film whose barrier layer was produced in a reduced pressure PECVD-process according to the state of the art. The OTR values are shown in dependence of the barrier layer thickness in nm, wherein the values for the film produced according to the invention are marked by triangles and the values of the film produced by PECVD are marked by circles. The graph shows clearly that in comparison with a polymer film coated according to the state of the art, at least for barrier thickness in the range below 10 nm, similar barrier qualities can be achieved with less layer thickness by the coating method according to the invention.

The invention claimed is:

1. A method for coating a web of a polymer film with an oxide layer by means of a flame-induced combustion chemical vapor deposition process (CCVD-process) comprising the steps of:
   supporting the web on an upper section of a circumferential surface of a drum with a surface to be coated facing away from the circumferential surface of the drum,
   producing a plurality of successive flame bands, wherein each flame band is produced from individual flames originating from individual nozzles of a nozzle matrix, and wherein each flame band includes an outer flame region;
   sustaining and directing the plurality of successive flame bands in a radial direction from above towards the upper section of the circumferential surface of the drum,
   rotating the drum, transporting the supported web on the upper section of the circumferential surface of the drum, through the plurality of successive flame bands, which flame bands extend at a distance from each other across a width of the web, and are sustained by being fed with a gas mixture comprising a combustible gas, an oxidant and a compound which is decomposed in the flame bands to form reactive particles to be deposited on the surface, wherein the gas mixture is exhausted upwards between the successive flame bands and wherein neighboring outer flame regions of successive flame bands converge with each other and continue towards exhaust means arranged between the flame bands, and
   keeping the circumferential surface of the drum at a predetermined temperature, and thus cooling the film surface opposite the surface to be coated.

2. The method according to claim 1, wherein, on transporting the web through the successive flame bands, the film surface to be coated is positioned in the area of a tip of an inner flame region.

3. The method according to claim 2, wherein the film surface to be coated is positioned outside an inner flame region at a distance of not more than 5 mm from said tip of said inner flame region.

4. The method according to claim 1, wherein by pressing the web against the circumferential surface of the drum, air is eliminated from between the web and the circumferential surface.

5. The method according to claim 1, wherein the web is supported by two drums arranged in succession and is transported by the circumferential surface of each drum through a plurality of successive flame bands.

6. The method according to claim 1, wherein the gas mixture comprises propane and air at a ratio of between 1/14 and 1/28.

7. The method according to claim 1, wherein the oxide layer is a barrier layer of silicon oxide, aluminum oxide, titanium oxide, cerium oxide, an oxide of a rare earth, or a mixed oxide.

8. The method according to claim 7, wherein the oxide layer is a silicon oxide layer and the compound to be decomposed is hexamethyldisiloxane, SiCl4 or SiH4.

9. The method according to claim 1, wherein at least two different gas mixtures are fed to successive flame bands.

10. The method according to claim 1, wherein an amount of the decomposable compound is matched to a speed of the polymer film through the flame bands such that the thickness of the deposited layer amounts to at least 2 nm per passage.

11. The method according to claim 1, wherein the total thickness of the deposited oxide layer is in the range of 5 to 200 nm.

12. The method according to claim 1, wherein the polymer film comprises PET, PA, PP or PE and has a thickness in the range of 1 to 100 μm.

* * * * *